Figure 1:
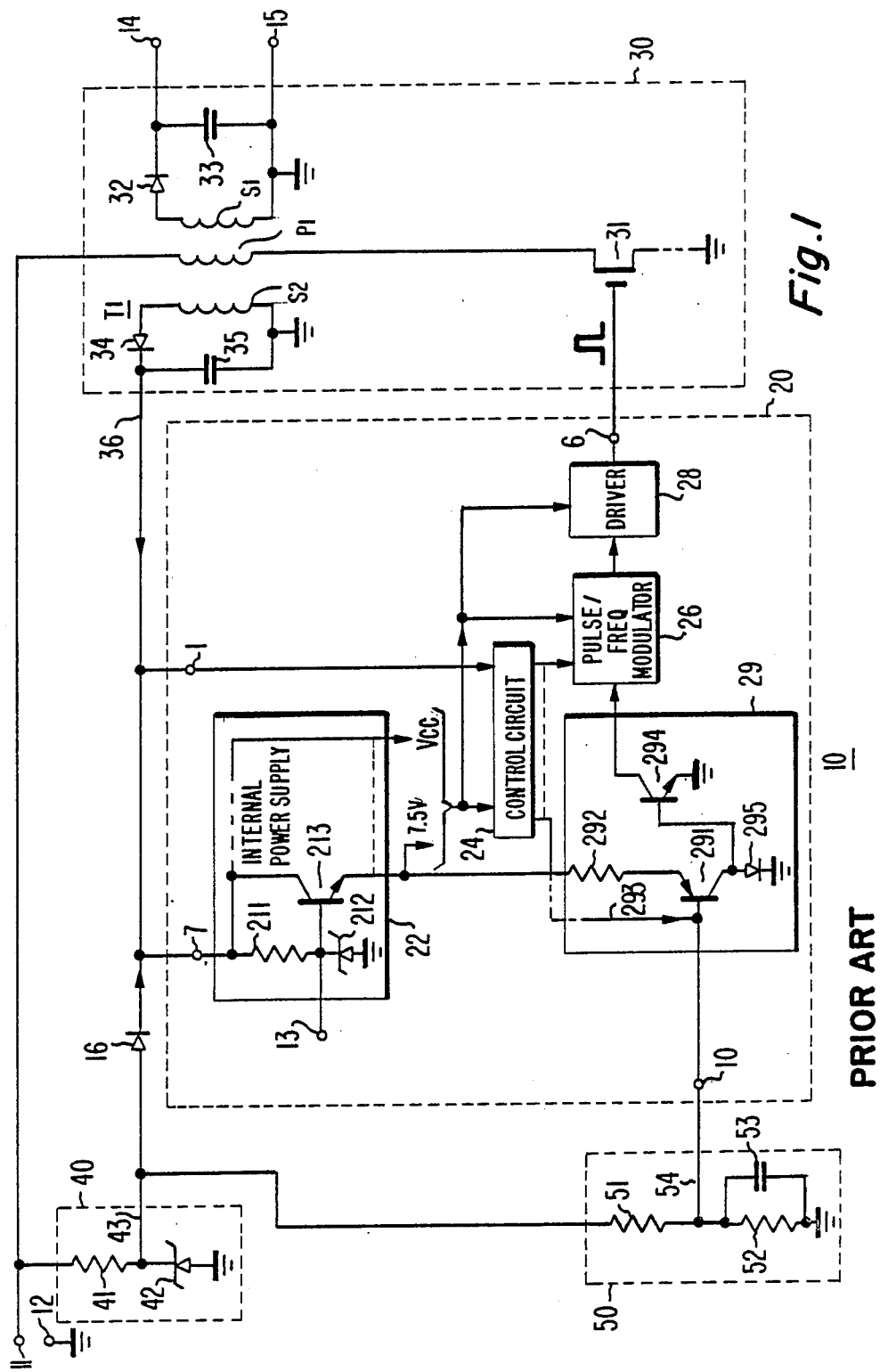

United States Patent [19]

Austin

[11] Patent Number: 4,737,669
[45] Date of Patent: Apr. 12, 1988

[54] SLOW-START SYSTEM FOR A CONTROL CIRCUIT

[75] Inventor: Wayne M. Austin, Hunterdon County, N.J.

[73] Assignee: RCA Corporation, Princeton, N.J.

[21] Appl. No.: 891,341

[22] Filed: Jul. 31, 1986

[51] Int. Cl.$^4$ .......................... H03K 5/13; H03K 3/01
[52] U.S. Cl. .................................. 307/592; 307/296 R
[58] Field of Search .................... 307/592, 296 R, 300, 307/601

[56] References Cited

U.S. PATENT DOCUMENTS 4,605,863 8/1986 Toudo et al. ...................... 307/592

FOREIGN PATENT DOCUMENTS 0143832 11/1980 Japan ................................ 307/592
0145433 9/1982 Japan ................................ 307/601

Primary Examiner—Stanley D. Miller
Assistant Examiner—Trong Quang Phan
Attorney, Agent, or Firm—Eugene M. Whitacre; Paul J. Rasmussen; Joseph J. Laks

[57] ABSTRACT

A control circuit having a slow-start section is enabled to carry out its expected, principal function(s) only after the voltage at the slow-start section input has reached a certain level. The system assures that a delay interval in control circuit operation is measured from the time devices within the circuit's internal voltage supply become effective to deliver voltage levels sufficient to allow the circuit to perform the principal function. A delay network is connected across a device of the internal voltage supply, which otherwise supplies an operating voltage level to the control circuit.

6 Claims, 2 Drawing Sheets

U.S. Patent    Apr. 12, 1988    Sheet 1 of 2    4,737,669

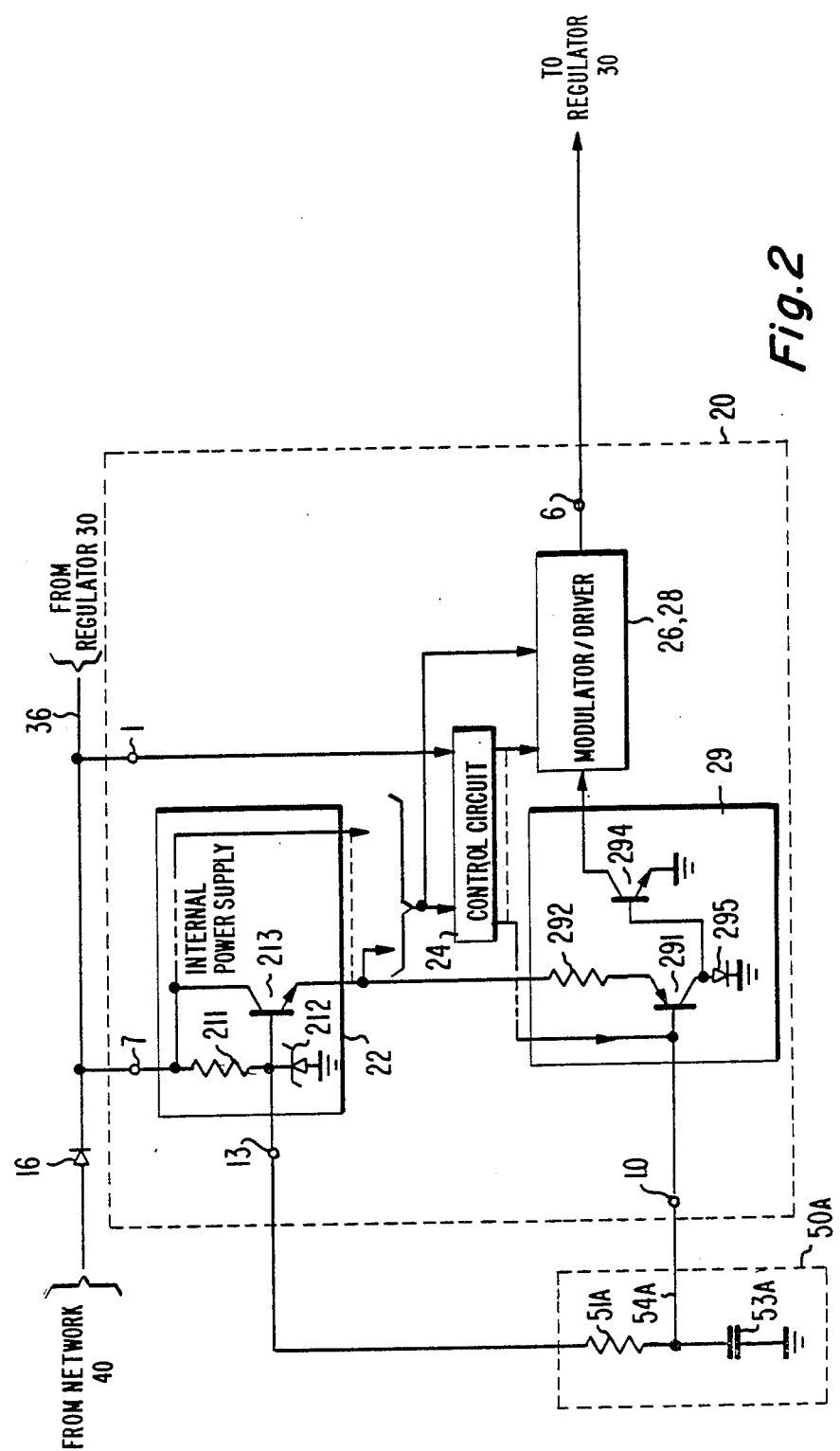

SLOW-START SYSTEM FOR A CONTROL CIRCUIT

This invention is directed to an improved system for delaying control circuit operation with respect to the application of operating voltage to the circuit's voltage supply input. The circuit may be of the integrated type.

Such a control circuit ordinarily includes a slow-start section. The slow-start section suppresses control circuit operation until voltage at a slow-start section input rises to a certain level.

A typical prior art arrangement: (a) applies to a resistive-capacitive (RC) network, external to the control circuit, a voltage derived from the same external supply which also is connected to the control circuit's voltage supply input and (b) connects a capacitor of the network to the slow-start section input. At start-up, i.e., when the capacitor is discharged and voltage is first applied to the control circuit's voltage supply input, voltage across the network capacitor starts to rise. Control circuit operation is suppressed or inhibited for a delay interval sufficient to allow the control circuit to become operative. The interval is determined by the time needed for the voltage on the capacitor to reach a certain level. In this way, the control circuit is given the opportunity to become fully effective before undertaking its operational function(s).

The slow-start system or arrangement typically has the RC network coupled to the same supply used to supply voltage to the voltage input of the control circuit. Assuming that voltage present at the circuit voltage supply input rises rapidly to the nominal level of the external source, the interval provided to develop the certain voltage at the network capacitor is determined by the values of the network's serially-connected resistors and the value of the network's capacitor, which typically is connected across one of the resistors.

This prior art arrangement presents a problem, in that the delay interval is not related to the time actually needed, for example, by devices within an internal voltage supply of the control circuit to develop the required voltage levels for distribution to the remainder of the control circuit. Another problem of the prior art arrangement is that the above-mentioned external network typically continues to draw current from the external source after the delay interval ends and during the time the control circuit is operational, i.e., when the circuit is carrying out its expected functions. Still another problem is that the level of voltage obtained from the external network is not related to levels of voltage developed by devices within the internal supply of the control circuit.

The present invention, which serves to solve these and other problems, is practiced in a system which, like the prior art, delays performance of a principal function of a control circuit for an interval following application of operating voltage to a voltage supply input of that circuit, to allow control circuit operation to be delayed until the circuit is in condition to carry out its expected function. The circuit in the contemplated system includes, as in the prior art, a slow-start section. The slow-start section, in the absence of voltage applied to an input thereof inhibits operation of the control circuit, and responds to the appearance of a certain minimum voltage at that slow-start input by enabling the control circuit to perform the above-mentioned functions. The system also includes an external RC network coupled to receive voltage derived from the external source, with a capacitor of the network coupled to the input of the slow-start section.

According to the invention, the RC network is connected directly to one of the several devices of the control circuit's internal voltage supply. That one device, which may be a Zener diode otherwise serving as source of a constant voltage level within the internal supply, develops thereacross a voltage greater than the certain level. With this arrangement, the delay interval relates directly to the time needed within the control circuit to develop voltage across the one device of the circuit's internal supply, so that the delay interval is measured in terms of the circuit's ability to operate functionally.

In the following detailed description of the invention, reference is made to the next-identified drawing figures, in which elements common to the figures bear like numbers.

In the drawing:

FIG. 1 is a prior art system for delaying the start of operation of a typical control circuit, which is incorporated in a power supply; and FIG. 2 shows a system having such a control circuit and an external RC network in accordance with the present invention.

In order to provide background to the present invention, reference first is made to the prior art power supply 10 shown in FIG. 1. Supply 10 includes a regulator 30, which is controlled by control circuit 20. Regulator 30 draws power from an unregulated voltage source connectable to terminals 11 and 12 of system 10. Control circuit 20 may be the CA1523 Variable Interval PUlse Regulator (VIPUR) circuit made by RCA Corporation.

The system of FIG. 1 operates as follows. When regulator 30 and control circuit 20 are operating, voltage of unregulated level appearing at terminals 11 and 12 is applied to the serially-connected primary winding P1 of transformer T1 and the conduction path of switching transistor 31 of regulator 30. Each pulse, in a stream of switching pulses produced at pin 6 by control circuit 20, is applied to the control electrode of transistor 31 to switch transistor 31 to its conducting condition. The consequent intermittent current flow in primary P1 induces current flow in each of transformer T1's secondary windings, S1 and S2.

Current induced in secondary winding S1 is rectified by diode 32; and the resulting direct voltage appearing across winding S1 and diode 32 is averaged by capacitor 33. The smoothed voltage is connected to supply output terminals 14 and 15. As is brought out below, the level of the output voltage is regulated in accordance with the operation of control circuit 20.

Current induced in secondary winding S2 of transformer T1 is rectified by diode 34, and the resulting voltage across winding S2 and diode 34 is averaged by capacitor 35 and applied to conductor 36. Voltage on conductor 36 is a smooth level and is applied to a voltage supply input (at pin 7) and to an error input (at pin 1) of control circuit 20.

In the following description, description of elements of control circuit 20 and their operation is not set forth in detail, because such detailed description is not necessary to the understanding of the present invention.

Voltage appearing on regulator output conductor 36 is applied via pin 7 to the input of voltage supply 22, which is internal to control circuit 20. More specifically, such voltage is applied to serially-connected, resistor 211 and zener diode 212, so that there appears on the cathode electrode of zener diode 212 a voltage, which stabilizes at a nominal 8.4 volt level when voltage on conductor 36 is at a nominal 13 volt level.

Internal supply 22 also includes other devices, such as transistor 213. Those other devices are interconnected to diode 212 and to each other. Diode 212 and the other supply 22 devices produce at respective outputs of internal supply 22 voltages of levels suitable for use throughout the remainder of control circuit 20.

With the appearance of voltage on conductor 36 and with the production of the various levels of voltage by internal supply 22, current control circuit 24 admits current to modulator 26. Modulator 26 responds to such admitted current by causing output driver 28 to produce the previously mentioned stream of switching pulses at pin 6 for application to the control electrode of regulator transistor 31.

The level of voltage on conductor 36 and at error input pin 1 varies about some nominal level, differences between actual and nominal levels being caused, for example, by changes in voltage level of the unregulated supply connected to terminals 11 and 12 or by changes in current drawn from output terminals 14 and 15. Within control circuit 20, deviations from the nominal error voltage level at pin 1 are detected by current control 24. Current control 24 responds to detected level deviations at pin 1 by causing modulator 26 to change the frequency and duty cycle of switching pulses produced at output pin 6 in directions which tend to return the level of voltage on conductor 36 to the nominal error level. In summary, as used in power supply 10, control circuit 20 regulates the frequency and duty cycle of switching pulses at pin 6 to maintain voltage across output terminals 14 and 15 at a substantially constant level.

The above-given explanation of power supply 10 operation presupposes that the circuit 20 already is operating and producing the stream of switching pulses at output pin 6. However, at start-up of supply 10, i.e., immediately after voltage appears at input terminals 11 and 12, control circuit 20 is not producing switching pulses, so that transistor 31 is turned off. Consequently, at that time transformer T1 does not produce a voltage at secondary winding S2 for application to output conductor 36 and to the input of internal supply 22.

To provide operating voltage to the internal voltage supply 22 at start-up, the supply 10 additionally includes an alternate path between terminal 11 and conductor 36. The alternate path includes voltage divider 40, which in turn comprises resistor 41 and zener diode 42 serially connected across input terminals 11 and 12. A tap 43 of divider 40 is connected through diode 16 to conductor 36 and voltage supply input pin 7. When regulator 30 is not producing voltage for application to conductor 36, diode 16 is forward-biased. Therefore, the alternate path provides operating voltage at pin 7 for the voltage input of internal supply 22. After regulator 30 and control circuit 20 become operative, the higher-level, rectified, smoothed voltage from the regulator 30 reverse-biases diode 16, to block the alternate path.

At start-up, i.e., when voltage first-appears across input terminals 11 and 12, it is undesirable to allow switching transistor 31 to respond to the early pulses produced at output pin 6 of circuit 20. Such initial output pulses may be produced before operation of control circuit 20 stabilizes, for example before internal supply 22 produces stabilized voltage levels at its respective outputs. If such operation before stabilization is attempted, the frequency or duty cycle of the early produced pulses may not be properly regulated. Lack of regulation, in turn, may cause damage to elements within regulator 30, control circuit 20, or external devices connected to terminals 14 and 15.

To assure that production of output pulses by control circuit 20 is withheld from the time voltage first is applied to input terminals 11 and 12 until control circuit 20 operation stabilizes, a slow-start system is provided to delay the start of circuit 20 operation from the time voltage first appears on terminals 11 and 12. That prior art slow-start system is described next.

Control circuit 20 includes slow-start section 29. As earlier mentioned, detailed description of slow-start section 29 and of other elements of control circuit 20 is not necessary to an understanding of the present invention. Accordingly, the following description of section 29 and other parts of circuit 20 is generalized and is provided only by way of example of functions provided by control circuit 20, whose start-up is to be delayed in accordance with the inventive system.

An input to slow-start section 29 extends from pin 10 to a base electrode of slow-start transistor 291. In the absence of external voltage applied to slow-start pin 10, transistor 291 is biased (as voltage develops at devices within internal supply 22) into conduction, causing current-mirror, diode 295 and transistor 294, to conduct and therewith divert current from the modulator 26. Such current diversion inhibits the production of output pulses (for use by driver 28) by modulator 26. The collector current of transistor 291 is returned to ground via diode 295 which (with transistor 294) acts as a current mirror. As a result of conduction in transistor 294, operation of modulator 26 is inhibited. On the other hand, when external voltage applied to pin 10 rises above the above-mentioned certain level, then conduction in transistor 291 is cut-off, causing transistor 294 to be non-conductive. Non-conduction in transistor 294 enables modulator 26 to function so that control circuit 20 supplies switching pulses at pin 6.

As indicated in FIG. 1, the prior art system for controlling voltage applied to slow-start pin 10 includes an external RC network 50. Network 50 is connected across the input voltage supply by way of tap 43 of divider 40. At start-up, the appearance of voltage across input terminals 11 and 12 and zener diode 42 allows current flow through serially-connected resistors 51 and 52 of network 50 and the accumulation of voltage across network capacitor 53. Capacitor 53 is connected in parallel with resistor 52 and at tap 54 to slow-start pin 10.

At the time voltage first appears across input terminals 11 and 12, at start-up, capacitor 53 is in a discharge state. As voltage levels develop at devices in supply 22, transistor 291 is biased to conduct, because the voltage at pin 10 is insufficient to cutoff transistor 291. During the delay interval, which is measured from the appearance of voltage across terminals 11 and 12, the voltage across capacitor 53 rises. The end of the delay interval is marked by the voltage across capacitor 53 reaching a certain level, which is sufficient to cut-off transistor 291.

The length of the delay interval is determined by factors such as the level of voltage developed at zener diode 42 and the values of resistors 51 and 52 and of capacitor 53, all of which are external to circuit 20 and none of which relates directly to the internal operation of circuit 20. The length of the delay interval provided by external network 50 is chosen to be at least as long as the estimated time needed by control circuit 20 to become operational. The described arrangement for providing the delay interval is not precise, because it is based on an interval calculated to be equal to or greater than the estimated time needed by circuit 20 to become operational. The described arrangement also is undesirable, because network 50 continues to draw current from tap 43 of divider 40 after the end of the delay interval.

In order to deal with the above-mentioned and other problems, the present invention uses an improved system illustrated in FIG. 2. In FIG. 2, slow-start section 29 of control circuit 20 is connected as indicated in FIG. 2 to an external RC network 50A, which is substituted for network 50 indicated in FIG. 1. Network 50A is connected via control circuit 20 pin 13 to the cathode electrode of and across internal supply 22 zener diode 212. RC network 50A consists of a single resistor 51A serially-connected to capacitor 53A. The power supply, in which the control circuit 20 of FIG. 2 and network 50A may be included, otherwise is similar to the power supply 10 indicated in FIG. 1, and, except for the slow-starting system, the operation is as previously described.

During the start-up, the voltage appearing on conductor 36 from the power supply input places devices of internal supply 22 in condition to provide respective voltage levels for distribution within circuit 20. Circuit 20 is considered to be in condition to initiate the delay interval when devices, such as zener diode 212, of internal supply 22, deliver respective voltage levels to other parts of circuit 20, such as current control circuit 24. As a consequence, the present invention is used to measure the delay interval by taking voltage for application to network 50 from such a device: namely, zener diode 212. The nominal voltage, 8.4 volts to be developed across diode 212 is greater than the certain voltage needed at pin 10 to cut-off conduction in slow-start transistor 291.

During start-up, the voltage across capacitor 53A of network 50A increases from zero as the voltage across zener diode 212 increases. When, as previously mentioned, the voltage at slow-start pin 10 reaches the certain level, transistor 291 is cutoff, and modulator 26 and the remainder of circuit 20 no longer is disabled from carrying out its expected functions.

In the specifically described embodiment of the invention, the ability of zener diode 212 within supply 22 to produce the required nominal output level of 8.4 volts may be regarded as an indication of the ability of the entire circuit 20 to perform its assigned function.

The delay interval is measured starting from the time at which voltage appears across diode 212 and the application of voltage to network 50A and ending when voltage at slow-start pin 10 reaches the level required to cutoff conduction in transistor 291. This relates the start of operation of circuit 20 to the ability of internal supply 22 to supply voltage levels to various parts of control circuit 24.

A second relationship between circuit 20 operation and the delay interval is provided by the connection of the emitter of slow-start transistor 291 through resistor 292 and the base-emitter junction of voltage supply 22 transistor 213 to the cathode of zener diode 212. This connection assures that the voltage present on diode 212 is higher (by the added $V_{be}$ voltage drops across NPN type transistors 213 and 291) than the threshold of transistor 291 at the time the delay interval ends and control circuit 20 becomes operative.

The above-described system of FIG. 2 offers a further advantage over the typical prior art system indicated in FIG. 1, in that RC network 50A includes one less resistor than the corresponding traditional RC network 50 indicated in FIG. 1. Still further, RC network 50A draws current only while capacitor 53A is being charged, in contrast to the prior art network 50, which continues to draw current during the time the control circuit 20 in FIG. 1 is operational.

While use of control circuit 20, whose operation is controlled by the present inventive system, has been described within the context of power supply 10, those skilled in the art will realize that such use is not a limitation on the invention, as set forth in the following claims.

What is claimed is:

1. A circuit arrangement that provides for a start-up delay in normal performance of a principal circuit operation, comprising:
    a first voltage reference device circuit for developing an energizing voltage upon initiation of said start-up;
    a control circuit that is incapable of providing said normal performance of said principal circuit operation until a supply voltage applied thereto attains an operating level;
    a stabilizing power supply including a second voltage reference device circuit coupled to said energizing voltage for generating and stabilizing said supply voltage at a stabilized supply terminal, the operating level of said supply voltage being derived in accordance with said second voltage reference device circuit and attaining said operating level after a first delay interval from said initiation of said start-up;
    a biasing arrangement coupled to said second voltage reference device circuit for generating a reference voltage related in level to that of said stabilized supply voltage;
    an inhibiting circuit coupled to said control circuit and including a semiconductor element coupled to said biasing arrangement and controllable in conduction in accordance with an input voltage and said reference voltage, said inhibiting circuit inhibiting said normal performance until said input voltage exceeds a threshold level; and
    an integrating network coupled to said second voltage reference device circuit and to said semiconductor element for integrating a voltage related in level to that of said reference voltage for generating said input voltage in a manner that varies in level during start-up so as to exceed said threshold level after elapse of a second delay interval from initiation of start-up, thereby inhibiting said normal performance until elapse of said second delay interval.

2. A circuit arrangement according to claim 1 wherein said semiconductor element includes a first transistor, said reference voltage biasing one of a base and emitter electrodes of said transistor, and said input voltage biasing the other electrode.

3. A circuit arrangement according to claim 2 wherein said other electrode is coupled to a junction terminal of a resistive capacitive voltage divider of said integrating network such that a direct current path is provided between said junction terminal and said stabilized supply terminal via said base and emitter electrodes of said first transistor.

4. A circuit arrangement according to claim 3 wherein said biasing arrangement includes a second transistor having its base-emitter path coupled to said stabilized supply terminal in a series relationship with said direct current path.

5. A circuit arrangement according to claim 2 wherein said inhibiting circuit includes a second transistor coupled to said first transistor in a manner that enables current in said second transistor in mirror current in said first transistor.

6. A circuit arrangement according to claim 1 wherein said control circuit includes a regulator circuit for generating a switching signal, said circuit arrangement further including a switched mode regulated supply responsive to said switching signal for creating a source of regulated output voltage that substitutes for said first reference voltage device circuit in developing said energizing voltage after elapse of said second delay interval.

* * * * *